United States Patent
Liu et al.

(10) Patent No.: US 12,029,012 B2
(45) Date of Patent: Jul. 2, 2024

(54) FLUID IMMERSION COOLING SYSTEM WITH MULTIPLE LAYERS OF COOLANT FLUIDS

(71) Applicant: SUPER MICRO COMPUTER, INC., San Jose, CA (US)

(72) Inventors: Yueh Ming Liu, Taipei (TW); Yu Hsiang Huang, Taipei (TW); Yu Chuan Chang, Taipei (TW); Tan Hsin Chang, Taipei (TW); Hsiao Chung Chen, Taipei (TW); Chia-Wei Chen, Taipei (TW); Chih-Ta Chen, Taipei (TW); Cheng-Hung Lin, Taipei (TW); Ming-Te Hsu, Taipei (TW)

(73) Assignee: Super Micro Computer, Inc., San Jose, CA (US)

( * ) Notice: Subject to any disclaimer, the term of this patent is extended or adjusted under 35 U.S.C. 154(b) by 362 days.

(21) Appl. No.: 17/383,607

(22) Filed: Jul. 23, 2021

(65) Prior Publication Data
US 2023/0027552 A1    Jan. 26, 2023

(51) Int. Cl.
*H05K 7/20* (2006.01)

(52) U.S. Cl.
CPC ......... *H05K 7/203* (2013.01); *H05K 7/20318* (2013.01); *H05K 7/20327* (2013.01)

(58) Field of Classification Search
CPC .... H05K 7/202; H05K 7/20218; H05K 7/203; H05K 7/20318; H05K 7/20381; H05K 7/2049; H05K 7/208; C23C 16/46; C23C 16/463; C23C 16/56
USPC ...................... 361/170, 274.2, 676–677, 688
See application file for complete search history.

(56) References Cited

U.S. PATENT DOCUMENTS

| | | | |
|---|---|---|---|
| 5,472,043 | A | 12/1995 | Larson et al. |
| 9,049,800 | B2 | 6/2015 | Shelnutt et al. |
| 9,195,282 | B2 | 11/2015 | Shelnutt et al. |
| 9,335,802 | B2 | 5/2016 | Shelnutt et al. |

(Continued)

FOREIGN PATENT DOCUMENTS

| | | |
|---|---|---|
| CN | 101410685 | 4/2009 |
| CN | 110537257 | 5/2023 |
| TW | 249885 | 6/1995 |

OTHER PUBLICATIONS

Taiwanese Office Action from Taiwanese Application No. 111126885 dated Aug. 22, 2023.

*Primary Examiner* — Tuan T Dinh
(74) *Attorney, Agent, or Firm* — Beyer Law Group LLP

(57) ABSTRACT

A fluid immersion cooling system includes a fluid tank that contains a layer of a dual-phase coolant fluid and one or more layers of single-phase coolant fluids. The dual-phase and single-phase coolant fluids are immiscible, with the dual-phase coolant fluid having a lower boiling point and higher density than a single-phase coolant fluid. A substrate of an electronic system is submerged in the tank such that high heat-generating components are immersed at least in the layer of the dual-phase coolant fluid. Heat from the components is dissipated to the dual-phase coolant fluid to generate vapor bubbles of the dual-phase coolant fluid. The vapor bubbles rise to a layer of a single-phase coolant fluid that is above the layer of the dual-phase coolant fluid. The vapor bubbles condense to droplets of the dual-phase coolant fluid. The droplets fall down into the layer of the dual-phase coolant fluid.

7 Claims, 4 Drawing Sheets

(56) References Cited

U.S. PATENT DOCUMENTS

| | | | |
|---|---|---|---|
| 9,351,429 B2 | 5/2016 | Shelnutt et al. | |
| 9,464,854 B2 | 10/2016 | Shelnutt et al. | |
| 10,018,425 B2 | 7/2018 | Shelnutt et al. | |
| 10,184,699 B2 | 1/2019 | Shedd et al. | |
| 10,985,089 B2 | 4/2021 | Hart et al. | |
| 11,435,410 B1* | 9/2022 | Fitch | H05K 7/20236 |
| 2013/0019627 A1* | 1/2013 | Yoshikawa | H05K 7/20818 |
| | | | 62/426 |
| 2013/0105120 A1 | 5/2013 | Campbell et al. | |
| 2014/0218859 A1* | 8/2014 | Shelnutt | H05K 7/20809 |
| | | | 361/679.46 |
| 2015/0022975 A1* | 1/2015 | Browne | H05K 7/14337 |
| | | | 361/700 |
| 2016/0234970 A1 | 8/2016 | Shelnutt et al. | |
| 2017/0064862 A1* | 3/2017 | Miyoshi | H01L 23/32 |
| 2017/0325355 A1* | 11/2017 | Lau | H05K 7/20381 |
| 2021/0102294 A1* | 4/2021 | Miljkovic | H01L 21/02271 |
| 2021/0153392 A1* | 5/2021 | Gao | H05K 7/20818 |
| 2021/0185850 A1* | 6/2021 | Kulkarni | H05K 7/20327 |

\* cited by examiner

FLUID IMMERSION COOLING SYSTEM WITH MULTIPLE LAYERS OF COOLANT FLUIDS

BACKGROUND OF THE INVENTION

1. Field of the Invention

The present invention relates to fluid immersion cooling of electronic systems.

2. Description of the Background Art

Electronic systems, such as information technology equipment (e.g., computers, routers, packet switches, cellular circuits), generate heat during operation. Cooling systems have been developed to prevent electronic systems from overheating. A simple cooling system involves the use of cooling fans to blow air towards heat-generating components of an electronic system. A more sophisticated approach is to submerge an electronic system in a coolant fluid (e.g., fluorochemical fluid), such as in a dual-phase fluid immersion cooling system. In a conventional dual-phase fluid immersion cooling system, heat generated by the electronic system turns a dual-phase coolant fluid into vapors, which rise to be collected by a condenser unit. The condenser unit is a piece of equipment that turns the vapors to liquid, which falls back down into the dual-phase coolant fluid, thereby completing the cooling cycle.

Conventional dual-phase fluid immersion cooling systems demonstrate excellent power efficiency but have several disadvantages. First, there is risk that the vapors will leak into the environment. Leakage is especially concerning because vaporized dual-phase coolant fluid is considered to have a Global Warming Potential (GWP). Second, bellows, which are needed for vapor balance in a conventional dual-phase fluid immersion cooling system, take too much space. Third, because of the high potential for leakage, conventional dual-phase fluid immersion cooling systems are relatively expensive to manufacture and operate.

SUMMARY

In one embodiment, a fluid immersion cooling system includes a fluid tank that contains a layer of a dual-phase coolant fluid and one or more overlying layers of single-phase coolant fluids. The dual-phase and single-phase coolant fluids are immiscible, with the dual-phase coolant fluid having a lower boiling point and higher density than a single-phase coolant fluid. A substrate of an electronic system is submerged in the tank such that one or more high heat-generating components mounted on the substrate are immersed at least in the layer of the dual-phase coolant fluid. Heat from the components is dissipated to the dual-phase coolant fluid to generate vapor bubbles of the dual-phase coolant fluid. The vapor bubbles rise to a layer of a single-phase coolant fluid that is above the layer of the dual-phase coolant fluid. In the layer of the single-phase coolant fluid, the vapor bubbles condense to droplets of the dual-phase coolant fluid. The droplets fall down into the layer of the dual-phase coolant fluid.

These and other features of the present invention will be readily apparent to persons of ordinary skill in the art upon reading the entirety of this disclosure, which includes the accompanying drawings and claims.

The use of the same reference label in different drawings indicates the same or like components. The drawings are not to scale.

DETAILED DESCRIPTION

In the present disclosure, numerous specific details are provided, such as examples of apparatus, components, and methods, to provide a thorough understanding of embodiments of the invention. Persons of ordinary skill in the art will recognize, however, that the invention can be practiced without one or more of the specific details. In other instances, well-known details are not shown or described to avoid obscuring aspects of the invention.

Figure 1:
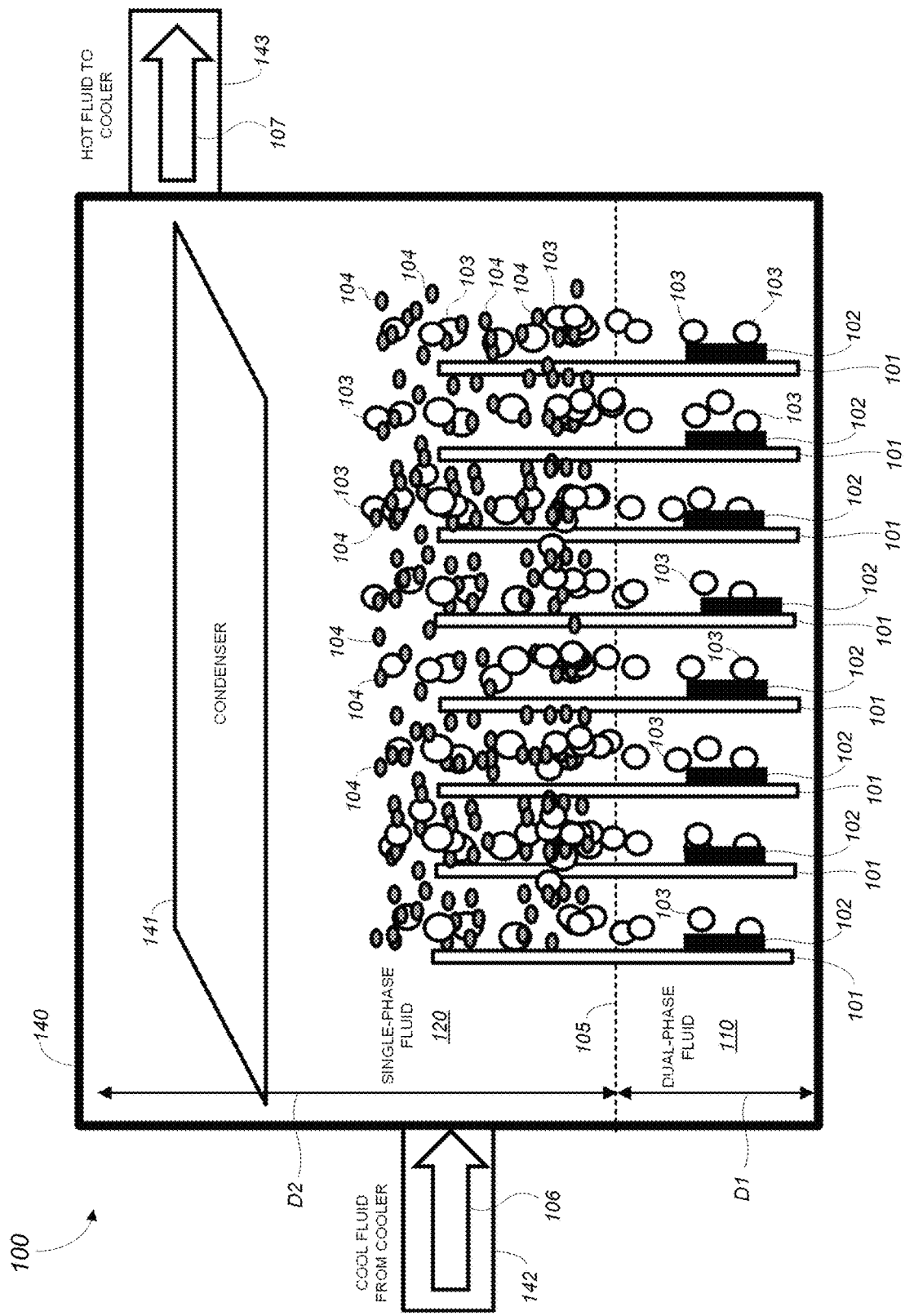
FIG. 1 shows a schematic diagram of a fluid immersion cooling system in accordance with an embodiment of the present invention.

FIG. 1 shows a schematic diagram of a fluid immersion cooling system 100 in accordance with an embodiment of the present invention. The fluid immersion cooling system 100 includes a fluid tank 140 that contains a layer of a dual-phase coolant fluid 110 and a layer of a single-phase coolant fluid 120. Both of the coolant fluids 110 and 120 are electrically non-conductive. The coolant fluids 110 and 120 are immiscible, with the liquid density of the coolant fluid 110 being higher than that of the coolant fluid 120. The coolant fluids 110 and 120 thus exist as separate fluid layers in the tank 140. The layer of the coolant fluid 110 is at the bottom of the tank 140 and the layer of the coolant fluid 120 is above the layer of the coolant fluid 110.

The coolant fluid 110 is a "dual-phase" fluid in that it has a relatively low boiling point, which may be in the range of 40° C. to 80° C. The coolant fluid 110 may have an operating environment temperature that is equal to or near its boiling point. The coolant fluid 110 has a lower boiling point but a higher density than the coolant fluid 120. Preferably, the coolant fluid 110 has as low viscosity as possible and a dielectric constant that is as close to 1 (vacuum value) as possible. The coolant fluid 110 may be a fluorochemical fluid. For example, the coolant fluid 110 may be the 3M™ Fluorinert™ Electronic Liquid, such as the product FC-3284, which is commercially available from the 3M Company. Other suitable dual-phase coolant fluids may also be employed.

The coolant fluid 120 is a "single-phase" fluid in that it has a relatively high boiling point, which may be higher than 80° C. The coolant fluid 120 has a higher boiling point but a lower density than the coolant fluid 110. The coolant fluid 120 has an operating environment temperature that is lower than the boiling point of the coolant fluid 110. Preferably, the coolant fluid 120 has as high viscosity as possible and a dielectric constant that is as close to 1 (vacuum value) as possible. A relatively high viscosity advantageously allows for better containment of vapor bubbles that rise from the coolant fluid 110. The coolant fluid 120 may comprise a dielectric oil. For example, the coolant fluid 120 may be the ElectroCool™ coolant, which is commercially available from Engineered Fluids, LLC. Other suitable single-phase coolant fluids may also be employed.

As shown in FIG. 1, a plurality of substrates 101 containing electronic devices 102 are placed in the tank 140. The substrates 101 may comprise printed circuit boards or other substrates of an electronic system, such as an Information Technology (IT) equipment. The electronic devices 102 are examples of heat spots, which are regions or components that generate a lot of heat. An electronic device 102 may be a Central Processing Unit (CPU), Graphics Processing Unit (GPU), power transistor, Field Programmable Gate Array (FPGA), etc. In one embodiment, the heat spots are completely immersed at least in the coolant fluid 110, whereas the rest of the substrates 101 are immersed in the coolant fluid 120. In the example of FIG. 1, in the tank 140, the coolant fluid 110 has a depth D1 and the coolant fluid 120 has a depth D2. The depth D1 may be much shallower than the depth D2 to conserve the relatively expensive coolant fluid 110 and to better prevent vapors of the coolant fluid 110 from escaping through the coolant fluid 120. A dash line represents a boundary 105 between the coolant fluids 110 and 120.

The substrates 101, being part of an electronic system, may be electrically interconnected by a motherboard, cables, etc. These interconnection components are not shown for clarity of illustration. During operation of the electronic system, the electronic devices 102 are powered ON and generate heat. Heat from the electronic devices 102 and other regions of the substrates 101 that are immersed in the coolant fluid 110 vaporizes the coolant fluid 110, thereby generating vapor bubbles 103 of the coolant fluid 110. The vapor bubbles 103 (depicted as white circles) rise and cross the boundary 105 into the layer of the coolant fluid 120. The coolant fluid 120 prevents the vapor bubbles 103 from leaking through. The higher the viscosity of the coolant fluid 120, the better the containment of the vapor bubbles 103. Besides preventing leakage, the coolant fluid 120 also conserves the relatively expensive coolant fluid 110.

In the layer of the coolant fluid 120, the vapor bubbles 103 condense into droplets 104 of the coolant fluid 110. The droplets 104 (depicted as small dark circles) eventually fall down and cross the boundary 105 back into the layer of the coolant fluid 110, completing the cooling cycle.

The tank 140 may be an open container and does not necessarily need to be sealed. The tank 140 may have provisions for accepting wiring and plumbing and for facilitating access to the substrates 101. Optionally, the fluid immersion cooling system 100 may include a condenser unit 141 that is configured to collect vapor bubbles 104 that have escaped through the layer of the coolant fluid 120. The condenser unit 141 may be positioned right above the coolant fluid 120 in the tank 140 to trap escaping vapor bubbles 104.

Optionally, as an additional cooling mechanism, the tank 140 may include an inlet 142 and an outlet 143. A cooler unit (not shown) may supply cool coolant fluid 120 to the tank 140 through the inlet 142 (see arrow 106). Hot coolant fluid 120 may flow out of the tank 140 through the outlet 143 (see arrow 107) to be cooled by the cooler unit. The cooler unit is a piece of equipment that is configured to cool hot coolant fluid.

Figure 2:
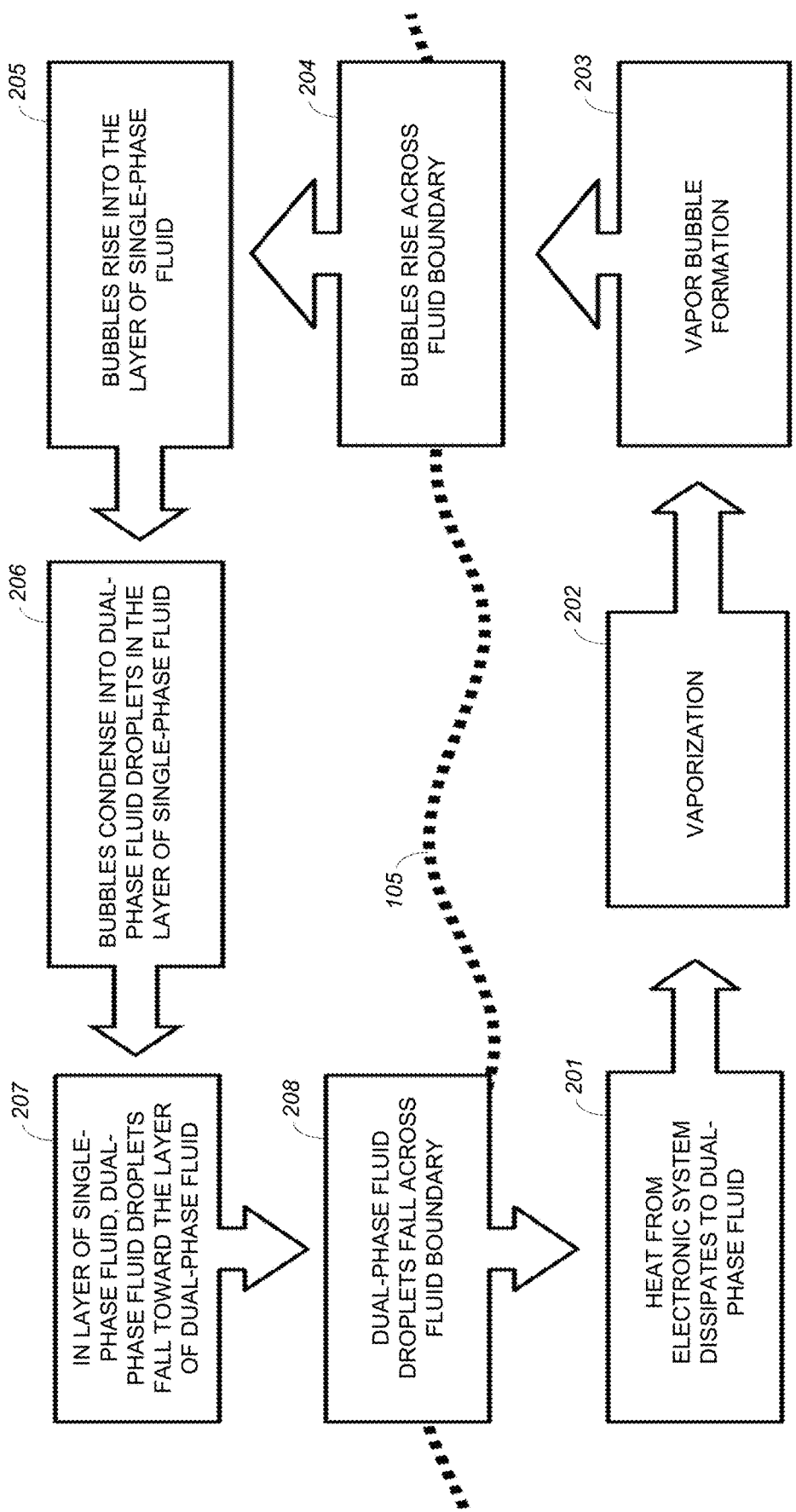
FIG. 2 shows a flow diagram of an operation of the fluid immersion cooling system of FIG. 1 in accordance with an embodiment of the present invention.

FIG. 2 shows a flow diagram of an operation of the fluid immersion cooling system 100 in accordance with an embodiment of the present invention. In the example of FIG. 2, the boundary 105 separates operations occurring in the layer of the dual-phase coolant fluid 110 (below the boundary 105) and operations occurring in the layer of the single-phase coolant fluid 120 (above the boundary 105).

In the example of FIG. 2, an electronic system is placed in the tank 140, which contains the layer of the coolant fluid 110 and the layer of the coolant fluid 120 (see FIG. 1). Heat from the electronic system dissipates to (FIG. 2, 201) and vaporizes (FIG. 2, 202) the coolant fluid 110, which as previously described is a dual-phase fluid. The vaporization results in formation of vapor bubbles of the coolant fluid 110 (FIG. 2, 203). The vapor bubbles rise across the boundary 105 (FIG. 2, 204) and into the layer of the coolant fluid 120 (FIG. 2, 205), which as previously described is a single-phase fluid. In the layer of the coolant fluid 120, the vapor bubbles condense into droplets of the coolant fluid 110 (FIG. 2, 206). In the coolant fluid 120, the droplets fall down toward the layer of the coolant fluid 110 (FIG. 2, 207). The droplets fall across the boundary 105 and into the layer of the coolant fluid 110 (FIG. 2, 208).

In an experiment, a graduated cylinder was filled with the 3M™ FC-3284 Fluorinert™ Electronic Liquid as a bottom layer of dual-phase coolant fluid and with a GRC dielectric oil as an upper layer of single-phase coolant fluid. The GRC dielectric oil is commercially-available from the Green Revolution Cooling company. The single-phase coolant fluid has a lower density and a higher viscosity than the dual-phase coolant fluid. The dual-phase coolant fluid has a boiling point of about 50° C. The single-phase coolant fluid has a relatively high boiling point, which was not reached during the experiment.

In the experiment, the graduated cylinder simulates a fluid tank. To simulate a cooler unit, a metal can containing ice was placed on the top of the graduated cylinder in the layer of single-phase coolant fluid. The bottom of the graduated cylinder was heated to simulate a heat spot. During the experiment, it was observed that heating the bottom of the graduated cylinder resulted in vapor bubbles of the dual-phase coolant fluid, which rose up to the single-phase coolant fluid. The vapor bubbles condensed into droplets in the single-phase coolant fluid, and the droplets fell back into the dual-phase coolant fluid as described in the flow diagram of FIG. 2. No leakage was observed during the experiment. The vapor bubbles were easily contained in the layer of single-phase coolant fluid to condense without vapor escape.

Figure 3:
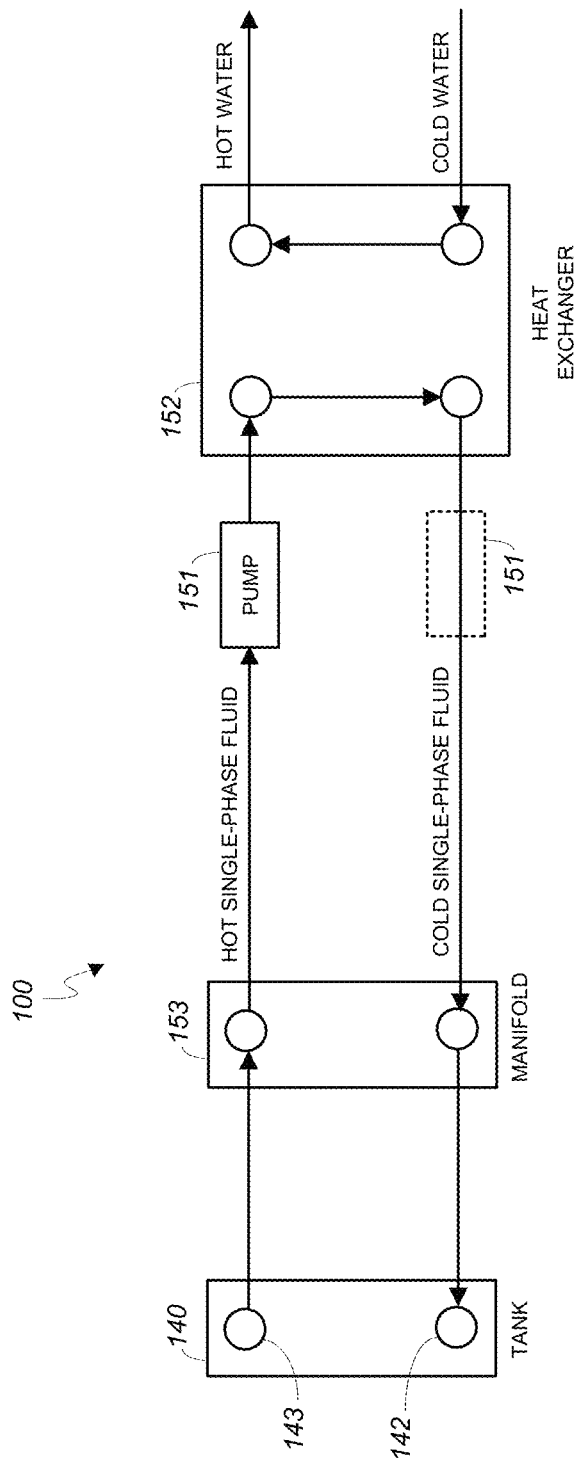
FIG. 3 shows a schematic diagram of the fluid immersion cooling system of FIG. 1 in accordance with an embodiment of the present invention.

FIG. 3 shows a schematic diagram of the fluid immersion cooling system 100 in accordance with an embodiment of the present invention. In the example of FIG. 3, the fluid immersion cooling system 100 includes a cooler unit comprising a manifold 153, one or more pumps 151, and a heat exchanger 152 (e.g., plate heat exchanger (PHE)) that is in-line with the pump 151. The pump 151 may be disposed on the hot-side (as shown in FIG. 3), cold-side, or both sides (see FIG. 3, additional pump 151 represented by dashed lines) of the plumbing between the tank 140 and the heat exchanger 152. In operation, the pump 151 circulates the coolant fluid 120 (i.e., single-phase coolant fluid) through the tank 140. Cold coolant fluid 120 enters the tank 140 through the inlet 142 (see also FIG. 1, 142) and hot coolant fluid 120 exits the tank 140 through the outlet 143. The manifold 153 facilitates cooling of the coolant fluid 120. The heat exchanger 152 further cools the coolant fluid 120 using cold water provided by an external cold water supply (not shown).

Figure 4:
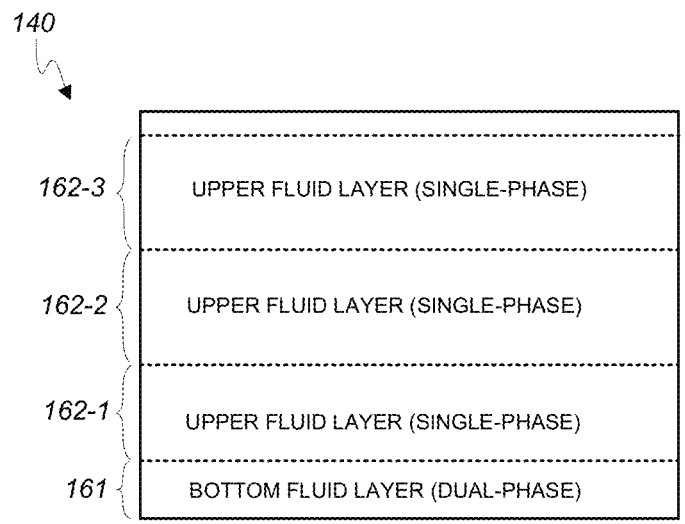
FIG. 4 shows a schematic diagram of a fluid tank containing multiple layers of coolant fluids in accordance with an embodiment of the present invention.

As can be appreciated, two or more layers of coolant fluids may be used to cool an electronic system in accordance with the teachings of the present disclosure. The layers of coolant fluids may comprise a bottom dual-phase coolant fluid layer and a plurality of single-phase coolant fluid layers on top of the bottom dual-phase coolant fluid layer. For example, as illustrated in FIG. 4, the tank 140 may be filled with a bottom dual-phase coolant fluid layer 161 and upper single-phase coolant fluid layers 162 (i.e., 162-1, 162-2, 162-3, . . . , 162-n). The single-phase coolant fluid layers 162 are "upper" layers relative to the dual-phase coolant fluid layer 161.

The properties of the dual-phase and single-phase coolant fluids may be as described above with reference to the coolant fluids 110 and 120. More particularly, the dual-phase coolant fluid layer 161 and single-phase coolant fluid layers 162 are immiscible, with the dual-phase coolant fluid layer 161 having higher density, lower viscosity, and much lower boiling than any of the single-phase coolant fluid layers 162. The single-phase coolant fluid layers 162 have different densities and are immiscible to allow for different levels of layering over the dual-phase coolant fluid layer 161 and may have different viscosities to facilitate condensation of vapor bubbles of the dual-phase coolant fluid layer 161.

Figure 5:
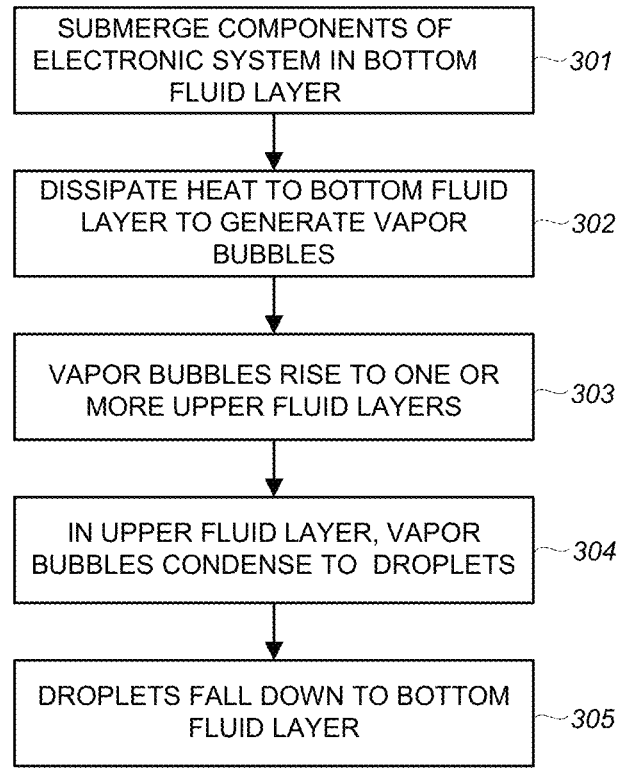
FIG. 5 shows a flow diagram of a method of cooling an electronic system in accordance with an embodiment of the present invention.

FIG. 5 shows a flow diagram of a method of cooling an electronic system in accordance with an embodiment of the present invention. In the example of FIG. 5, an electronic system is placed in a fluid tank containing a bottom layer of dual-phase coolant fluid and one or more upper layers of single-phase coolant fluids. High heat generating components of the electronic system are submerged at least in the bottom layer of dual-phase coolant fluid (FIG. 5, 301). Heat from the components of the electronic system dissipates to the dual-phase coolant fluid to generate vapor bubbles of the dual-phase coolant fluid (FIG. 5, 302). The vapor bubbles rise to at least one of the upper layers of single-phase coolant fluids (FIG. 5, 303). In a layer of single-phase coolant fluid, the vapor bubbles condense to droplets of the dual-phase coolant fluid (FIG. 5, 304). The droplets fall down toward the layer of dual-phase coolant fluid (FIG. 5, 305).

A fluid immersion cooling system for cooling electronic systems have been disclosed. While specific embodiments of the present invention have been provided, it is to be understood that these embodiments are for illustration purposes and not limiting. Many additional embodiments will be apparent to persons of ordinary skill in the art reading this disclosure.

What is claimed is:

1. A fluid immersion cooling system comprising:
   a fluid tank containing a component of an electronic system;
   a layer of a dual-phase coolant fluid in liquid state in the fluid tank, the component of the electronic system being immersed at least in the layer of the dual-phase coolant fluid in the fluid tank;
   a layer of a first single-phase coolant fluid in liquid state in the fluid tank, the first single-phase coolant fluid and the dual-phase coolant fluid being immiscible, the layer of the first single-phase coolant fluid being over the layer of the dual-phase coolant fluid,
   wherein the dual-phase coolant fluid has a higher density and a lower boiling point than the first single-phase coolant fluid;
   wherein the cooling system further comprising: a layer of a second single-phase coolant fluid in the fluid tank,
   wherein the second single-phase coolant fluid, the first single-phase coolant fluid, and the dual-phase coolant fluid are immiscible,
   wherein the layer of the second single-phase coolant fluid is over the layer of the first single-phase coolant fluid, and
   wherein the dual-phase coolant fluid has a higher density and a lower boiling point than the second single-phase coolant fluid.

2. The fluid immersion cooling system of claim 1, wherein the first single-phase coolant fluid comprises a dielectric oil.

3. The fluid immersion cooling system of claim 1, wherein the dual-phase coolant fluid comprises a fluorochemical.

4. The fluid immersion cooling system of claim 1, further comprising:
   a cooler unit that is coupled to an outlet and an inlet of the fluid tank, the cooler unit being configured to cool the first single-phase coolant fluid.

5. The fluid immersion cooling system of claim 1, further comprising:
   a condenser that is disposed above the layer of the first single-phase coolant fluid, the condenser being configured to collect and condense vapor bubbles of the dual-phase coolant fluid that have not been contained by the layer of the first single-phase coolant fluid.

6. The fluid immersion cooling system of claim 1, wherein the component of the electronic system is a central processing unit (CPU).

7. The fluid immersion cooling system of claim 4, wherein the cooler unit comprises:
   a pump that is configured to circulate the first single-phase coolant fluid; and
   a heat exchanger that is configured to cool the first single-phase coolant fluid.

* * * * *